United States Patent
Lee et al.

(10) Patent No.: US 6,933,779 B2
(45) Date of Patent: Aug. 23, 2005

(54) VARIABLE GAIN LOW NOISE AMPLIFIER

(75) Inventors: Kwyro Lee, Daejon-si (KR); Tae Wook Kim, Seoul (KR)

(73) Assignee: Integrant Technologies Inc., Seongnam (KR)

( * ) Notice: Subject to any disclaimer, the term of this patent is extended or adjusted under 35 U.S.C. 154(b) by 21 days.

(21) Appl. No.: 10/633,589

(22) Filed: Aug. 5, 2003

(65) Prior Publication Data

US 2004/0056712 A1 Mar. 25, 2004

(30) Foreign Application Priority Data

Aug. 5, 2002 (KR) .................... 10-2002-0046066

(51) Int. Cl.⁷ .................... H03F 1/14; H03F 3/191; H03G 3/30
(52) U.S. Cl. .................... 330/51; 330/283; 330/305
(58) Field of Search ................ 330/51, 124 R, 330/129, 283, 305

(56) References Cited

U.S. PATENT DOCUMENTS 5,548,246 A  *  8/1996  Yamamoto et al. ........... 330/51
6,144,254 A     11/2000 Irvine et al.
6,586,993 B2 *  7/2003  Macedo ...................... 330/51

* cited by examiner

Primary Examiner—Steven J. Mottola
(74) Attorney, Agent, or Firm—Shinjyu Global IP Counselors, LLP

(57) ABSTRACT

The present invention is related to a variable gain low noise amplifier that optimizes input matching, gain and noise characteristics, and linearity. The variable gain low noise amplifier according to an embodiment of the present invention includes a first amplifying cell that operates in a high gain mode, a second amplifying cell that operates in a low gain mode, a selectively matching circuit, and a first short-circuit means. The variable gain low noise amplifier according to the present invention selects the best operation in each gain mode so that the circuit operated in high and low gain modes does not affect a load of another circuit.

8 Claims, 8 Drawing Sheets

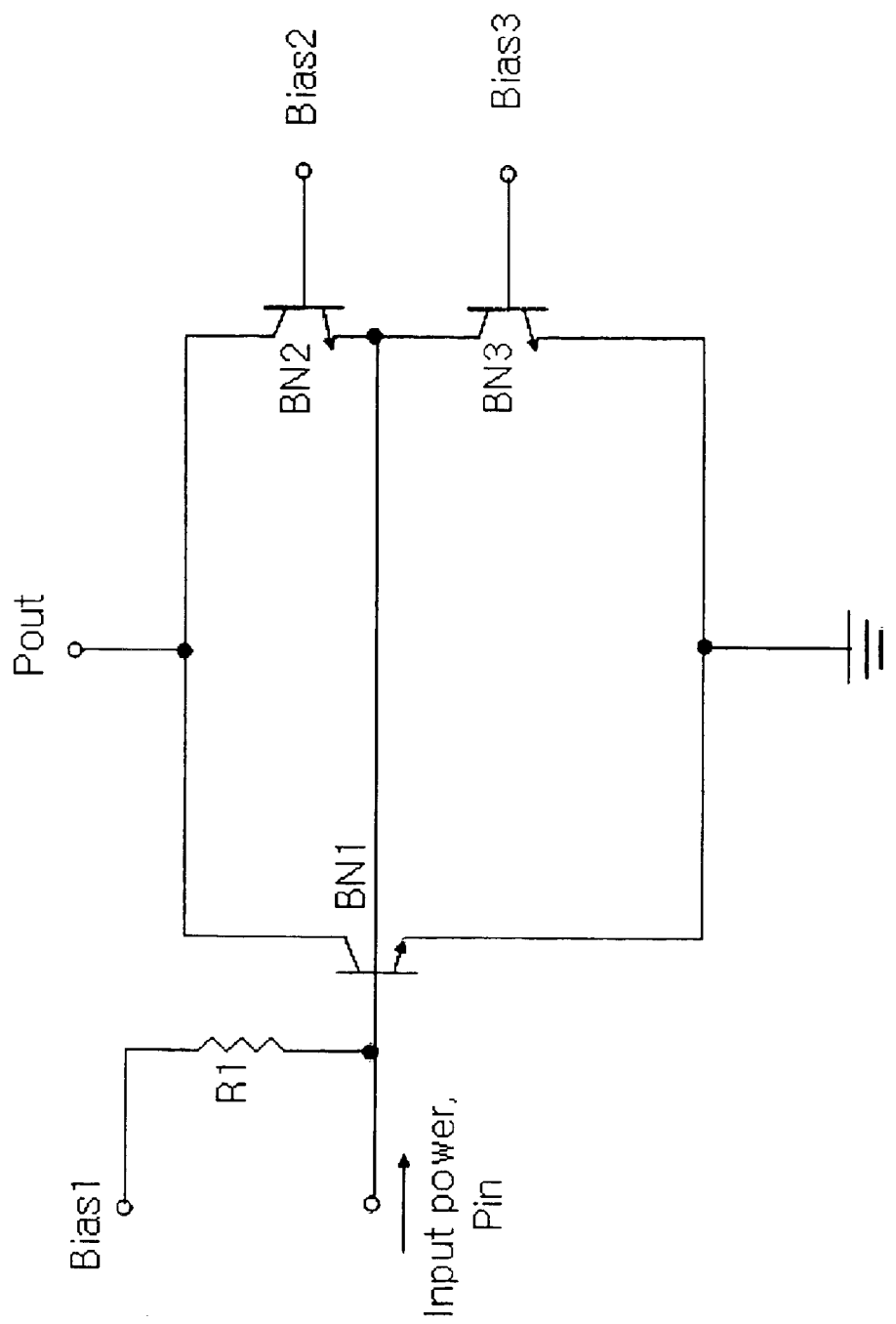
(Prior Art)
FIG. 1

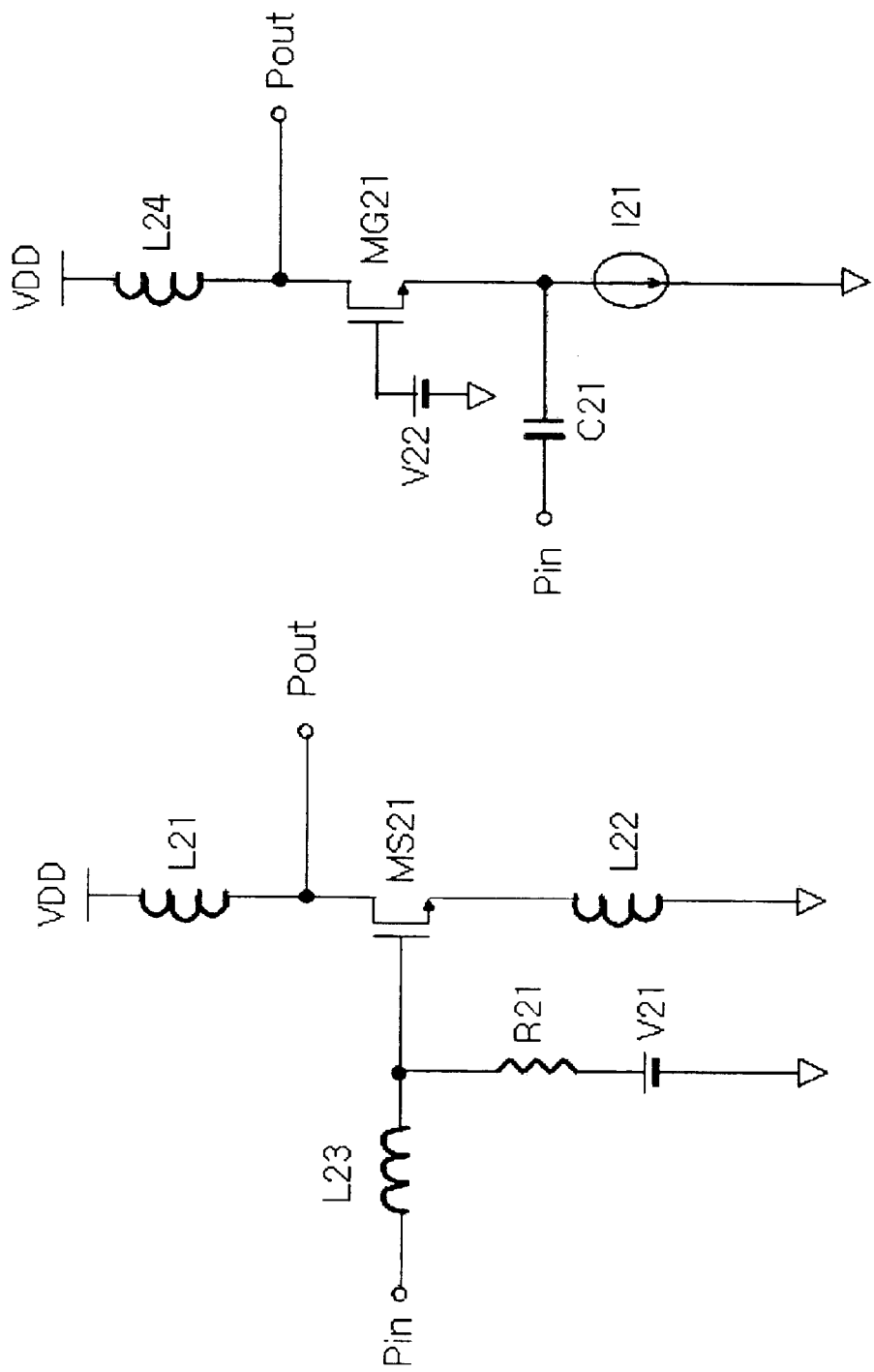
(Prior Art)
FIG. 2b
(Prior Art)
FIG. 2a

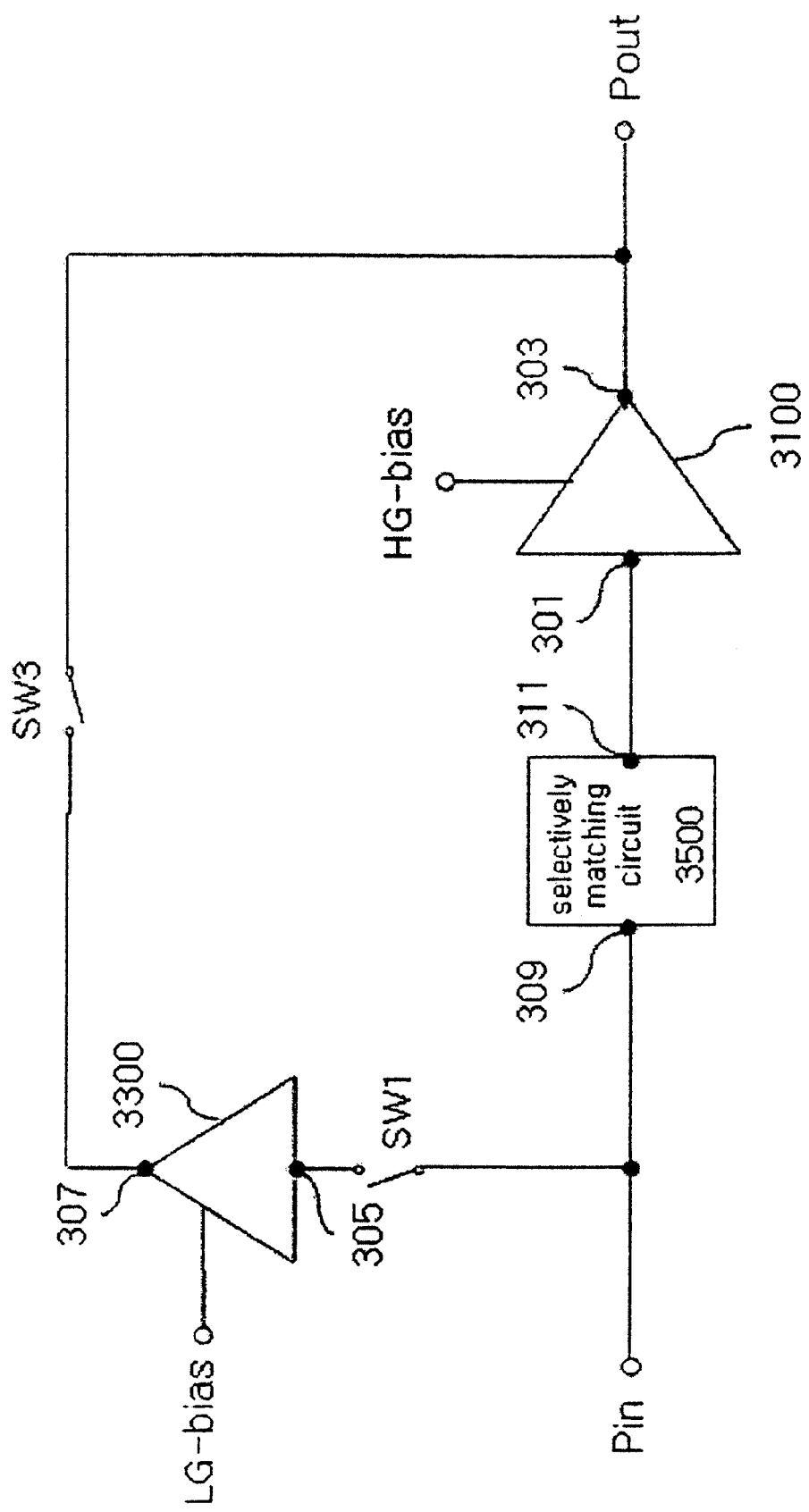
FIG. 3

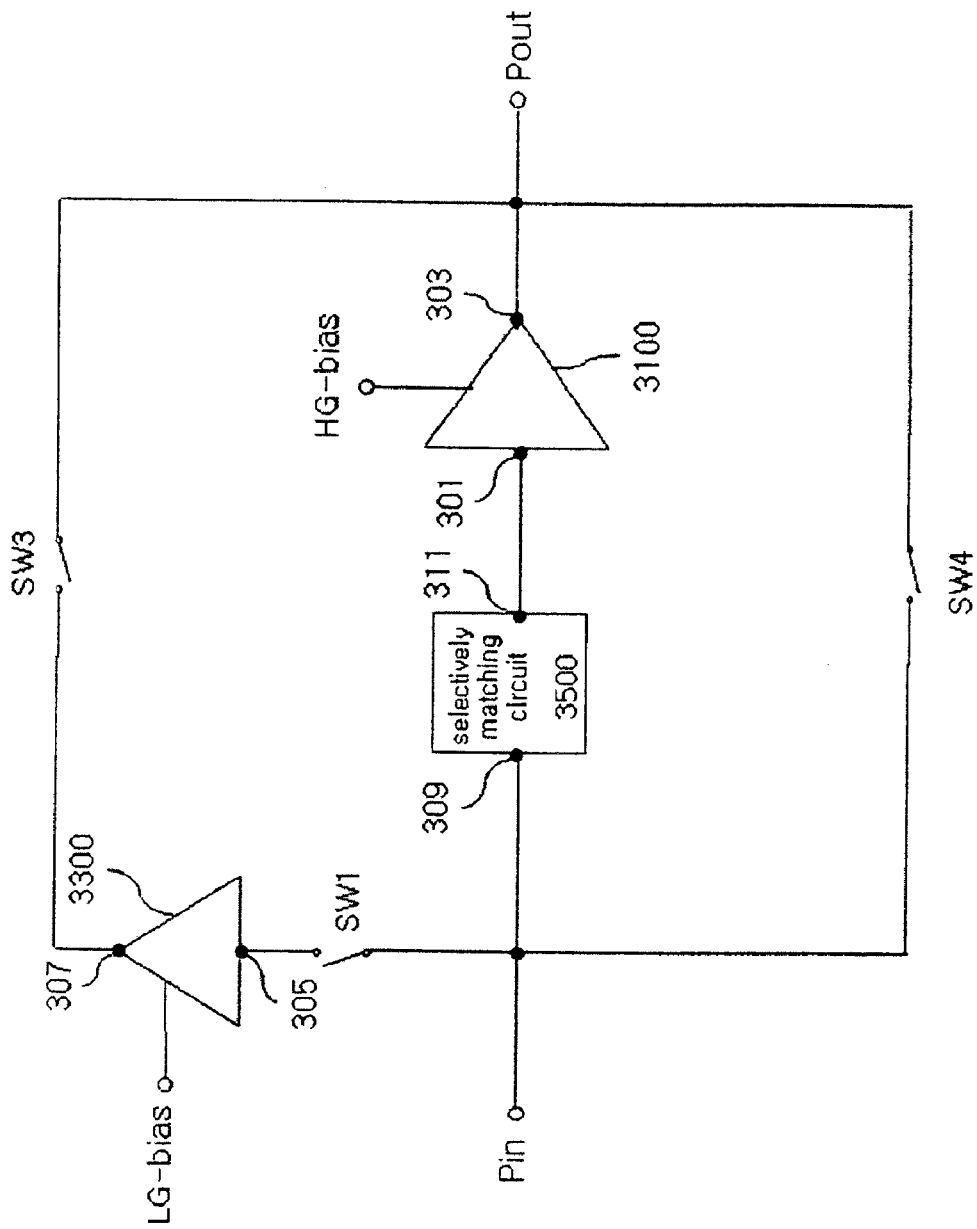
FIG. 4

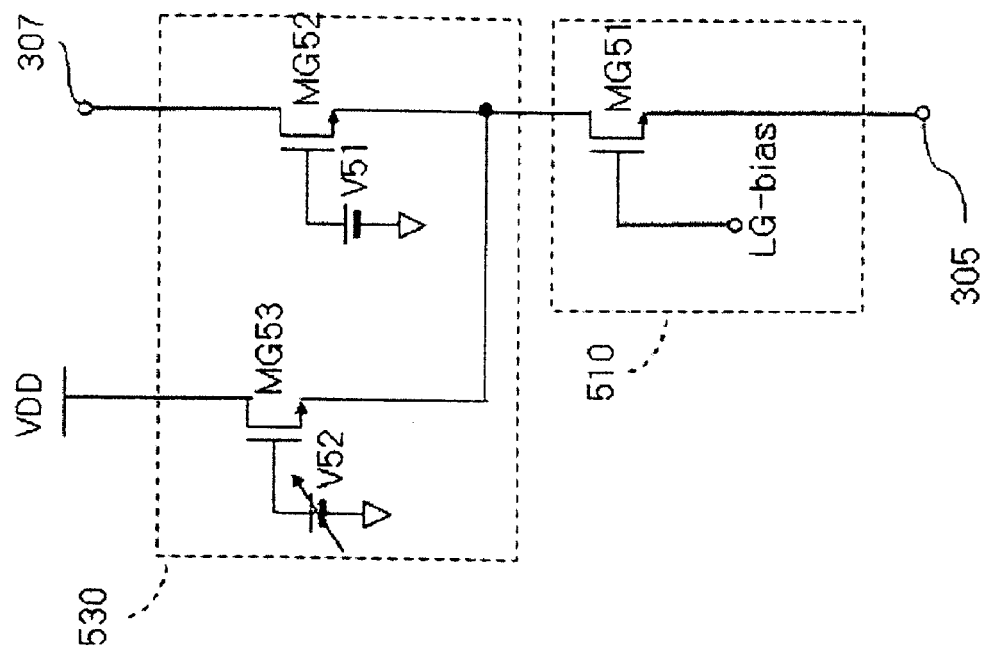
FIG. 5b
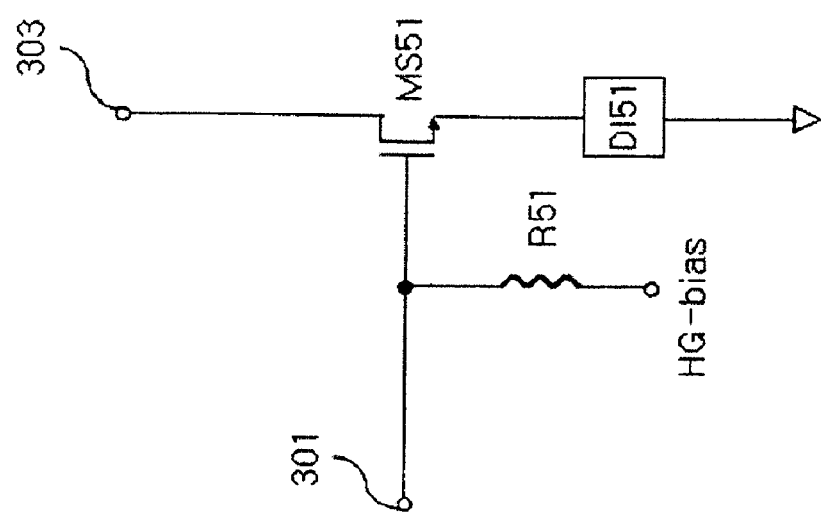
FIG. 5a

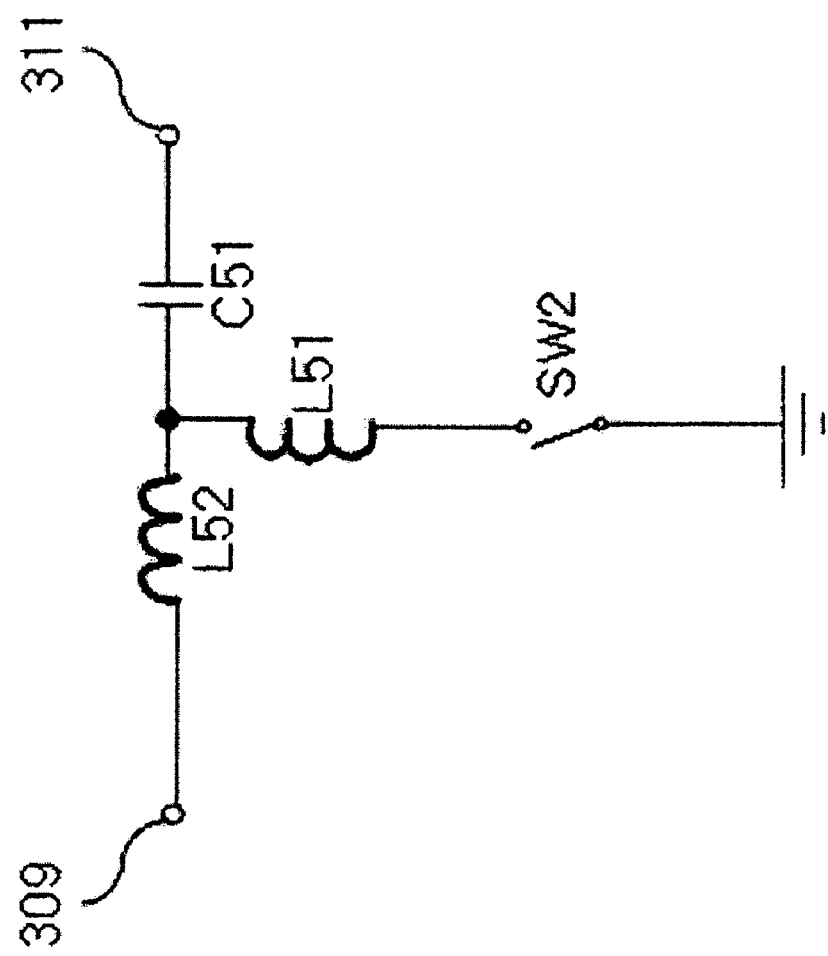
FIG. 5c

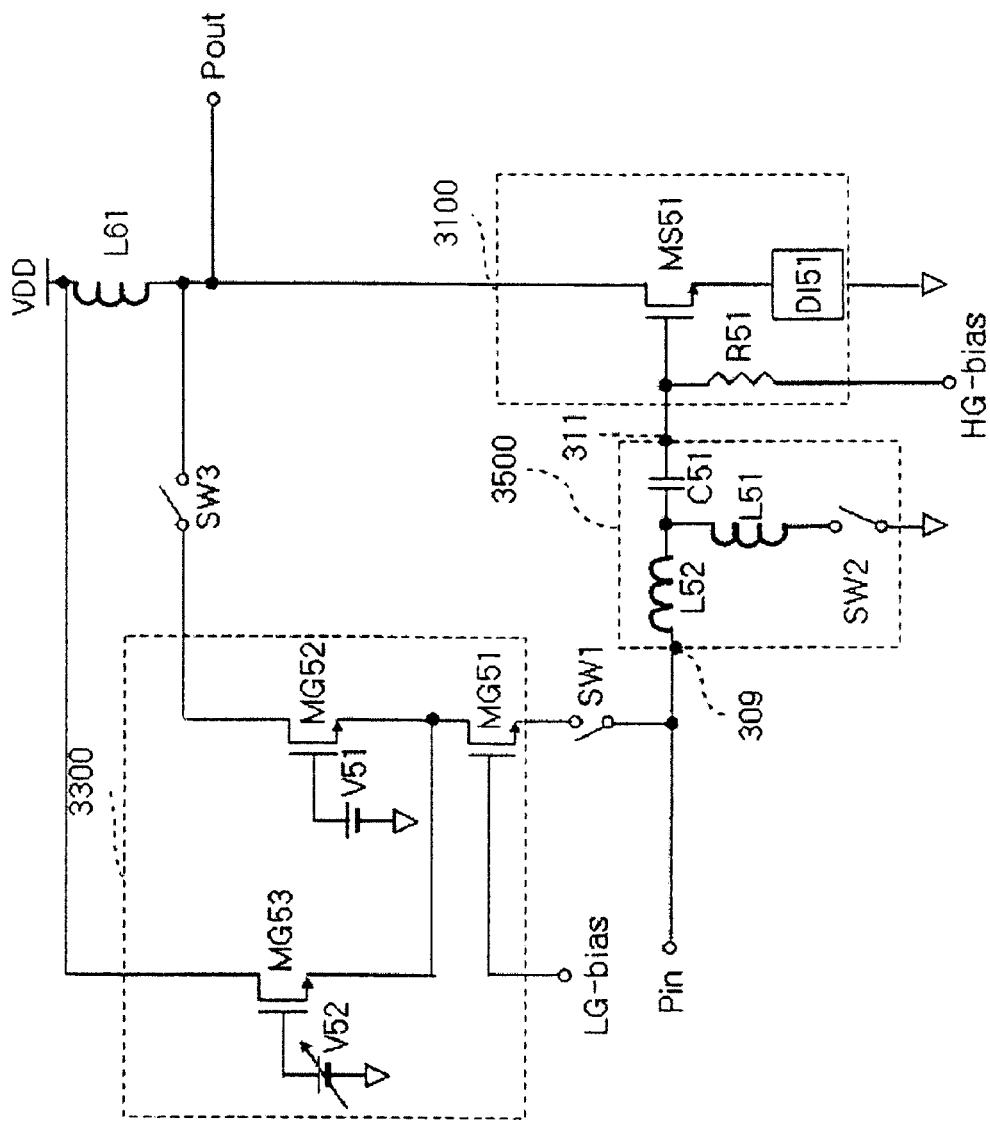
FIG. 6a

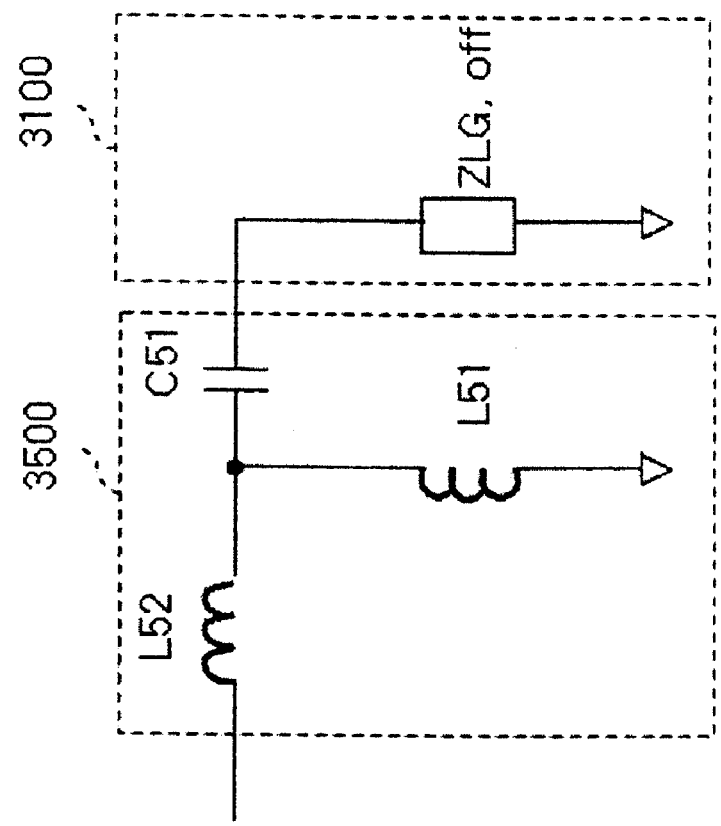
FIG. 6c
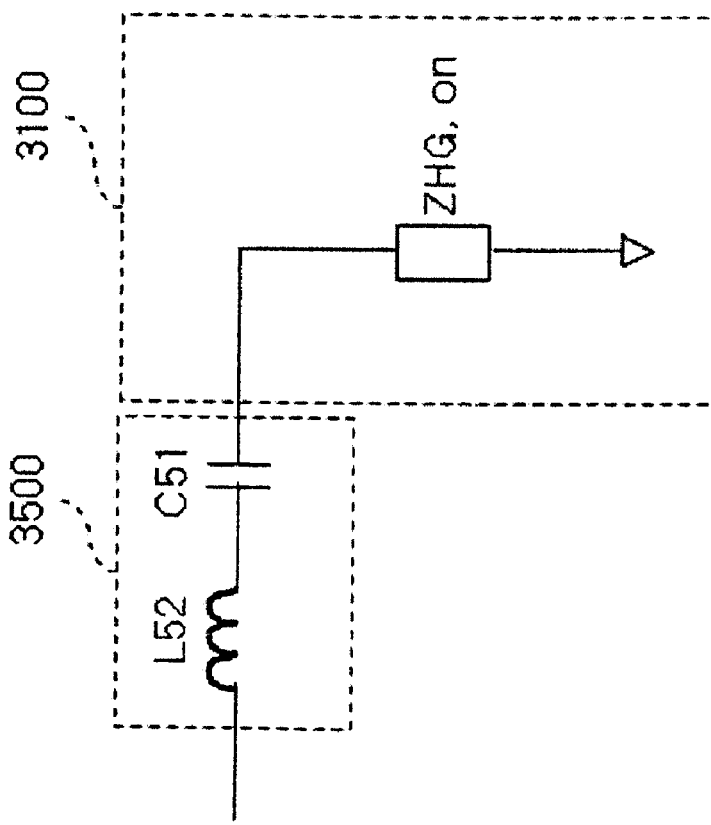
FIG. 6b

VARIABLE GAIN LOW NOISE AMPLIFIER

TECHNICAL FIELD

The present invention relates to a Low Noise Amplifier (hereinafter referred to as an "LNA"), more specifically, it is related to a variable gain LNA that is operated most suitably in input matching, gain and noise characteristics, linearity, etc.

BACKGROUND OF THE INVENTION

A first terminal is comprised of an amplifier that generally amplifies small signals to large signals in wireless equipment, for example a portable phone, TV, etc. This amplifier is made to have an amplifying operation having low noise and high gain characteristics when the signal is very small. But linearity is demanded rather than the amplifying operation when the signal is relatively large. Therefore, the amplifier satisfies more than two kinds of amplifying modes according to the input signal level, and it is necessary that the amplifier selects one of them in the wireless frequency receiving equipment.

As a low noise amplifier of the prior art, it is disclosed in U.S. Pat. No 6,144,254 that it is possible to switch between a low gain and high gain state.

FIG. 1 shows a circuit diagram of a low noise amplifier disclosed in U.S. Pat. No. 6,144,254.

As shown in FIG. 1, the low noise amplifier comprises a common-emitter BN1 (the first NPN transistor to operate in a high gain state), common-base BN2 (the second NPN transistor to operate in a low gain state), third NPN transistor BN3 (the third NPN transistor for provide bias current in BN2), and resistor R1.

That is, a collector of the first NPN transistor BN1 is connected to an output terminal Pout of an LNA, a base is connected to an input terminal Pin of an LNA and the first bias input terminal Bias1, and an emitter is grounded. The resistor R1 is connected between the first bias input terminal Bias1 and first NPN transistor BN1.

A collector of the second NPN transistor BN2 is connected to the output terminal Pout of the LNA, a base is connected to the second bias input terminal Bias2, and an emitter is connected to the input terminal Pin of LNA and a collector of the third NPN transistor BN3.

A base of BN3 is connected to the third bias input terminal Bias3, and an emitter is grounded.

Hereinafter an operation of the LNA of the prior art is described, referring to FIG. 1.

In the high gain state, the Bias1 is high, and the Bias2 and Bias3 are low. Therefore, the first NPN transistor BN1 is activated and performs the amplifying operation of a high gain, in the high state. Here, the second transistor BN2 and the third transistor BN3 are turned off.

In the low gain state, the Bias2 and Bias3 are high, and the Bias1 is low. Therefore, BN2 and BN3 are activated and perform the low gain amplifying operation, in the low gain state. Here, BN1 is turned off.

The low noise amplifier shown in FIG. 1 selects one of the states between high gain and low gain, and then operates the high-gain or low-gain amplifying operation in accordance with the size of the received signal. But, the circuits operated for each gain state are affected by for the load of the other, because input terminals of the emitter-common first NPN transistor BN1 and base-common second NPN transistor BN2 are directly connected to each other, that is the base of BN1 is directly connected to a emitter of BN2, in the low noise amplifier shown in FIG. 1. Namely, when the low noise amplifier operates in a high gain state, the capacitance of an emitter terminal of BN2 acts as a load for high gain circuits. As a result, the gain, matching, and noise characteristics of the high gain state are not good, and the capability of the low noise amplifier is reduced. In addition, when the low noise amplifier operates in the low gain state, the capability of the low gain state is reduced by the capacitance of the base terminal of BN1 in the same way as with the high gain state. Because two mode impedance levels of the input terminal are at substantially the same level, the impedances act as a load against each other.

SUMMARY OF THE INVENTION

The object of the present invention is to provide a variable gain low noise amplifier in which the circuits are designed to operate in the best suited way such that each gain mode does not affect the capability of the best suited circuit to operate in the other gain mode.

Another object of the present invention is to provide a variable gain low noise amplifier for which input matching, gain, noise characteristics, linearity, etc. can display the capability of the best suited circuit in different modes.

Another object of the present invention is to provide a variable gain low noise amplifier which is operated according to the size of a receiving signal in more than two amplifying modes, and can be varied between the gain in low gain modes.

Another object of the present invention is to provide a variable gain low noise amplifier whose power consumption is low.

To achieve above objects, a variable gain low noise amplifier, which amplifies the signal applied in an input terminal and outputs to an output terminal, comprises a first amplifying cell, which comprises a first terminal and second terminal connected to the output terminal, amplifies the signal applied to the first terminal to high gain, and outputs to the second terminal in high gain mode; a second amplifying cell that comprises a first terminal and second terminal connected to the output terminal, amplifies the signal applied to the first terminal to low gain, and outputs to the second terminal in a low gain mode; a selectively matching circuit that comprises a first terminal connected to the input terminal and second terminal connected to the first terminal of the first amplifying cell, and selectively changes an input impedance of the first amplifying cell, a first short-circuit means connected between the input terminal and the first terminal of the amplifying cell, and transmits the signal applied to the input terminal to the first terminal of the second amplifying cell in the operation of low gain mode; and wherein the selectively matching circuit changes the input impedance such that the power transmitted to the first amplifying cell of the signal applied to the input terminal is to be maximized in the operation of the high gain mode, and to be minimized to essentially zero in the operation of the low gain mode.

The variable gain low noise amplifier of the present invention further comprises a short-circuit means connected between the second terminal of the second amplifying cell and the output terminal.

The variable gain low noise amplifier of the present invention further comprises a short-circuit means connected between the input terminal and the output terminal.

The variable gain low noise amplifier of the present invention is provided, wherein the first amplifying cell comprises first, second, third terminals, amplifying element, resistor and degeneration impedance, and wherein the amplifying element, resistor, and degeneration impedance control the amounts of current that flow from the first terminal to the second terminal in proportion to the voltage applied to the third terminal; and a first terminal of the amplifying element is formed to connect to the second terminal of the first amplifying cell, the second terminal is connected with one of terminals of the degeneration impedance, the third terminal is connected with one of terminals of the resistor and then formed to connect to the first terminal of the first amplifying cell, the other terminal of the resistor is applied to the HG-bias voltage of activating the first amplifying cell in an operation of high gain mode, the other terminal of the degeneration impedance is grounded, and the amplifying element is connected to common mode of the second terminal.

The variable gain low noise amplifier of the present invention is provided, wherein the second amplifying cell comprises a first, second, and third terminals; a first amplifying element controls the amounts of current flowing from the first terminal to the second terminal in proportion to the voltage applied to the third terminal; wherein the second terminal of the first amplifying element is formed to connect to the first terminal of the second amplifying cell, and the third terminal is applied to the LG-bias voltage to activate the second amplifying cell in the low gain mode operation, and the first amplifying element comprises an amplifying unit connected to common mode of the third terminal; and the second and third amplifying elements, voltage source, and variable voltage source, control the amounts of current that flow from the first terminal to the second terminal in proportion to the voltage applied to the third terminal; wherein the first terminal of the second amplifying element is formed to the second terminal of the second amplifying cell, the second terminal is connected to the first terminal of the first amplifying element of the amplifying unit by connecting with the second terminal of the third amplifying element, the third terminal is connected to one of the terminals of the voltage source, the first terminal of the third amplifying element is connected to the power source, the third terminal is connected to the variable voltage source, and the other terminals of the voltage source and variable voltage source are grounded.

A variable gain low noise amplifier of the present invention is provided, wherein the matching circuit comprises a first and second inductor, capacitor, and short-circuit means; and one of the terminals of the first inductor is connected with the second inductor and the capacitor, the other terminal is connected to the short-circuit means, the other terminal of the second inductor is formed of the first terminal of the matching circuit, the other terminal of the capacitor is formed to connect to the second terminal of the matching circuit and the other terminal of the short-circuit means is grounded.

BRIEF DESCRIPTION OF THE DRAWINGS

FIG. 1 shows a circuit diagram of a low noise amplifier of the prior art.

FIG. 2a shows a circuit diagram of a source-common amplifier of the prior art.

FIG. 2b shows a circuit diagram of a gate-common amplifier of the prior art.

FIG. 3 shows a circuit diagram of a variable gain LNA according to an embodiment of the present invention.

FIG. 4 shows a circuit diagram of a variable gain LNA according to another embodiment of the present invention.

FIG. 5a shows a circuit diagram of a first amplifying cell according to the present invention for the variable gain LNA shown in FIG. 3 or FIG. 4.

FIG. 5b shows a circuit diagram of a second amplifying cell according to the present invention for the variable gain LNA shown in FIG. 3 or FIG. 4.

FIG. 5c shows a circuit diagram of a selectively matching circuit according to the present invention for the variable gain LNA shown in FIG. 3 or FIG. 4.

FIG. 6a shows a circuit diagram of the variable gain low noise amplifier shown in FIG. 3 using circuits shown in FIGS. 5a, 5b and 5c.

FIG. 6b shows an equivalent circuit diagram of an input part of the first amplifying cell in order to describe the operation of selective matching circuits in accordance with an embodiment of the present invention, when the variable gain low noise amplifier is operated in a high gain mode.

FIG. 6c shows an equivalent circuit diagram of the input part of the first amplifying cell in order to describe the operation of selective matching circuit in accordance with an embodiment of the present invention, when the variable gain low noise amplifier is operated in a low gain mode.

DETAILED DESCRIPTION

Hereinafter, preferred embodiments of the present invention will be described in detail with reference to the attached drawings.

Here, a common source and gate low noise amplifier of the prior art will be described, and then proper embodiments of a variable gain low noise amplifier according to present invention will be described in detail with reference to the attached drawings.

FIG. 2a shows a common source amplifier of the prior art.

Referring to FIG. 2a, a common source amplifier comprises an NMOS transistor MS21, first inductor L21, second inductor L22 and third inductor L23, resistor R21 and voltage source V21. The drain of the NMOS transistor MS21 is formed to connect to an output terminal Pout connected with one of terminals of first inductor L21, the gate is connected with the resistor R21 and third inductor L23, and the source is connected with one of the terminals of the second inductor L22. The other terminal of the first inductor L21 is connected to a power source VDD, the other terminal of the second inductor L22 is grounded, and the other terminal of third inductor L23 is formed to connect to an input terminal Pin of the amplifier. The voltage source V21 is connected between the other terminal of the resistor R21 and the ground.

The common source amplifier shown in FIG. 2a amplifies the signal applied through the input terminal Pin in a high gain mode, and can be matched to the input power and noise through a degeneration of the source. Accordingly, the source common amplifier is proper to maximize noise characteristics and gain. But, its weak point is that linearity is bad due to a voltage amplification effect caused by capacitance of the third inductor L23 and NMOS transistor MS21.

FIG. 2b shows circuit diagram of gate common amplifier of the prior art.

Shown in FIG. 2b, the gate common amplifier comprises a NMOS transistor MG21, an inductor L24, a capacitor C21, and a current source I21. The drain of the NMOS transistor MG21 is formed to connect to an output terminal Pout of the amplifier connected with one of the terminals of the inductor L24, the gate is connected to one of the terminals of the voltage source V22, and the source is connected to one of the terminals of the current source 121 and capacitor C21. The other terminal of the voltage source V22 is grounded, the other terminal of the inductor L24 is connected to the power VDD, and the other terminal of the current source 121 is grounded. The other terminal of the capacitor C21 is formed to connect to an input terminal Pin of the amplifier.

The gate common amplifier shown in FIG. 2b amplifies the signal applied through the input terminal Pin in a low gain mode. Because it cannot effect voltage amplification for use in an input matching circuit in the gate common amplifier, the gain and noise characteristics are bad compared with the source common amplifier shown in FIG. 2a. But, it is easy to match an input resistance through the gm value by controlling of the current that flows to the NMOS transistor because the input resistance is 1/gm. The value of the input resistance is much smaller than that of the source common amplifier shown in FIG. 2a. Its strong point is that the gate common amplifier can obtain a very high linearity compared to the source common amplifier, because the linearity of gm is superior in cases in which a recently developed transistor has a small channel length. And it is easy for the gate common amplifier to operate a variable gain function by means of adding a circuit to vary the output current in the output terminal of the amplifier.

Hereinafter describes an embodiment of a variable gain low noise amplifier (LNA) is described.

The variable gain LNA according to the present invention makes use of an amplification element that is a MOSFET transistor. The amplification element comprises a gate, source, and drain. The MOSFET transistor has the characteristics that allows the direction of a current flowing from the source to the drain or the other way to be decided according to the value and polarity of the voltage applied to the gate. Other amplification elements like the MOSFET are a bipolar junction transistor (BJT), junction field effect transistor (JFET), metal oxide semiconductor field effect transistor (MOSFET), metal semiconductor field effect transistor (MESFET), etc.

Hereinafter describes mostly the MOSFET among the above amplification elements. But the sprit and scope of the present invention is not limited to the MOSFET element and may be applied all the other equivalent elements. And hereinafter describes mostly an N type MOSFET, but it is obvious to those skilled in the art that the spirit and scope of the present invention may be applied to a P type MOSFET and is not limited to the N type MOSFET.

FIG. 3 shows a circuit diagram of a variable gain LNA according to an embodiment of the present invention.

As shown in FIG. 3, the variable gain LNA according to an embodiment of the present invention comprises a first amplifying cell 3100, second amplifying cell 3300, selectively matching circuit 3500, and first means of short circuit or switch SW1. The first amplifying cell 3100 comprises a first terminal 301 and second terminal 303, and amplifies a signal applied to the first terminal 301 for high gain while minimizing additional noise in the high gain mode. The second amplifying cell 3300 comprises a first terminal 305 and second terminal 307, and amplifies a signal applied to the first terminal 305 to control the gain in the low gain mode. The selectively matching circuit 3500 comprises a first and second terminal 309, 311 and selectively changes an input impedance of the first amplifying cell 3100 for that the circuit operated in each gain mode does not act on a load respectively.

Hereinafter the connections of the LNA of FIG. 3 are described.

The first terminal 301 of the first amplifying cell 3100 is connected to the second terminal 311 of the selectively matching circuit 3500, and the second terminal 303 is connected to the second terminal 307 of the second amplifying cell 3300 and formed to an output terminal Pout of the LNA. The first terminal 305 of the second amplifying cell 3300 is connected to the first short-circuit means or switch SW1. The first terminal 309 of the selectively matching circuit 3500 is connected to the other terminal of the first short-circuit means or switch SW1 and formed to connect to an input terminal Pin of the LNA.

As shown in FIG. 3, the third short-circuit terminal may be comprised between the second terminal 307 of the second amplifying cell 3300 and the output terminal Pout in the variable gain LNA according to an embodiment of the present invention. And with that structure, the output signal of the second amplifying cell 3300 outputs to the output terminal of the LNA due to the third short-circuit means or switch SW3 in the low gain mode operation.

Hereinafter an operation of the variable gain LNA according to an embodiment of the present invention will be described.

The variable gain LNA operates in two modes, a high gain mode and a low gain mode according to the power level of a received signal. That is, it operates in the high gain mode when the power level of the received signal is under a threshold of power that has been decided beforehand, and operates in the low gain mode when the power level of the received signal exceeds the threshold power.

The short-circuit means may reduce the signal due to having a resistance value in the state of short-circuit that can be disregarded, and may operate with a load having a finite reactance value in the open-circuit state when it is operated in the high gain mode. Accordingly, use of the short-circuit means in the circuit operated in high gain mode must be restrained, and the above load characteristics of the short-circuit means must be carefully and respectively considered for each amplification circuit operation.

When it using the high gain mode, the first amplification cell 3100 is activated when the first short-circuit means SW1 is opened and HG-bias is applied to the first amplifying cell 3100. And the second amplifying cell 3300 is inert by not applying an LG-bias.

Accordingly, when it is operated in the high gain mode, the impedance of the second amplifying cell 3300 operated in the low gain mode does not affect the first amplifying cell 3100 operated in the high gain mode by the opening of the first short-circuit means SW1, and only the open impedance of the first short-circuit means affects the high gain mode circuit. But, the input of the first amplifying cell 3100 operated in the high gain mode is generally matched to 50~70 ohm, that is standard resistance. due to the selectively matching circuit 3500, the open impedance of the first short-circuit means SW1 has a high value of more than 50~70 ohm. So, the effect of the open impedance having a load for the first amplifying cell 3100 is ignored. Accordingly, the variable gain LNA according to an embodiment of the present invention may be the most suitable operation in high gain mode, and amplifies the input signal for a high gain.

When in the low gain mode, the second amplifying cell 3300 is activated by the first short-circuit means being shorted and LG-bias applied. And, the first amplifying cell 3100 is inert by not applying the HG-bias. The selectively matching circuit 3500 changes the input impedance of the first amplifying cell 3100 in the low gain mode to a high impedance of more than the aforementioned decided value (generally standard resistance value: 50~75 ohm). Accordingly, in the low gain mode the variable gain LNA may be the most suitable operation because the first amplifying cell 3100 is not operated to bear a load of the second amplifying cell 3300 in the low gain mode.

FIG. 4 shows a circuit diagram of a variable gain LNA according to another embodiment of the present invention.

The embodiment shown in FIG. 4 is different from the variable gain LNA according to the embodiment shown in FIG. 3 in the point that a fourth short-circuit means or switch SW4 is arranged between the input terminal Pin and the output terminal Pout. The variable gain LNA according to another embodiment of the present invention directly transmits the received signal to the output terminal Pout through the fourth short-circuit means. So, power consumption may be reduced according to this embodiment. Moreover high linearity is provided and signal distortion is reduced by eliminating an input signal level of post part (normally mixer) of the variable gain LNA.

FIG. 5*a* shows a circuit diagram of a first amplifying cell according to an embodiment of the present invention in the variable gain LNA shown in FIG. 3 and FIG. 4.

As shown in FIG. 5*a*, the first amplifying cell 3100 is embodied in a common-source, and comprises an amplifying element MS51, degeneration impedance DI51, and resistor R51. The drain of the amplifying element MS51 is formed to connect to the second terminal 303 of the first amplifying cell 3100, the gate is connected to the terminal of the resistor R51 and is formed to connect to the first terminal 301 of the first amplifying cell 3100, and the source is connected to a terminal of degeneration impedance DI51. In the other terminal of the resistor R51, when operating in the high gain mode, the first amplifying cell 3100 is activated by HG-biasing voltage, and the other terminal of degeneration impedance DI51 is grounded. Degeneration impedance DI51 can be made to use the passive or the active elements of resistor and inductor, etc.

As mentioned above, the common-source amplifier has excellent noise and gain characteristics, and can get satisfying input power and noise matching results at the same time, through the degeneration impedance DI51 connected to the source of the amplifying element MS51. Also, as shown in FIG. 3, the common-source amplifier can display the capability of the best suited circuit for the noise and gain sides because the matching circuit 3500 is connected to the first terminal of the first amplifying cell 3100. Therefore, when the low noise amplifier is used with the above common-source amplifier in the high gain mode which needs a high gain amplifying operation, it can display its utmost capabilities.

FIG. 5*b* is a circuit diagram for showing the inside structure of the second amplifying cell 3300 in accordance with an embodiment of the present invention in the variable gain low noise amplifier shown in FIG. 3 or FIG. 4.

As shown in FIG. 5*b*, the second amplifying cell 3300 is embodied in a common-gate, and comprises an amplifying part 510 and gain part 530.

The amplifying part 510 of the second amplifying cell 3300 comprises the first amplifying element MG51. The drain of the first amplifying element MG51 is connected to the connecting point of the source of the second and third amplifying element MG52, MG53 of the variable gain part, and when operating in the low gain mode, LG-biasing voltage that activates the second amplifying cell 3300 is driven, and the source is formed at the first terminal 305 of the second amplifying cell 3300.

In a variable gain low noise amplifier in accordance with an embodiment of the present invention, preferably, the current source (not shown, please refer to FIG. 2) is provided between the source of the first amplifying element MG51 and ground. In this case, it can change trans-conductance (gm) data of the first amplifying element MG51, and it can control input impedance data of the amplifying part 510, by control of the current source data.

A variable gain part 530 comprises the second and the third amplifying elements MG52, MG53 and voltage source V51 and variable voltage source V52. The drain of the second amplifying element MG52 is formed to connect to the second terminal 307 of the second amplifying cell 3300, and gate is connected to one terminal of the voltage source V51, and the source is connected to the third amplifying element MG53. The drain of the third amplifying element MG53 is connected to the power source VDD, the gate is connected to the variable voltage source V52. The drain of the third amplifying element MG53 is connected to the power source VDD, and gate is connected to variable voltage source V52.

An amplifying part 510 comprises the first amplifying element MG51 connected to a common-gate, and amplifies the signal driven in the first terminal 305 of the second amplifying cell 3300. As mentioned above, the common-gate amplifier can easily controlled input matching, and it has excellent linearity.

As the variable gain part 530 controls the current quantities which divide the current coming from the amplifying part into the second and the third amplifying elements MG52, MG53, by the control of the variable voltage source V52, the variable gain part 530 can vary the output coming from the second terminal 307 of the second amplifying cell 3300, and it can control in succession the gain data of the second amplifying cell 3300. In addition, because the current of the first amplifying element MG51 is not changed by the variable gain part 530, the trans-conductance data of the first amplifying element MG51 is regular, the input matching of the second amplifying cell 3300 is not changed.

Therefore, if the variable gain part is used in the second amplifying cell 3300, which has common-gate construction shown in FIG. 5*b*, in the low gain mode, it can perform successive variable gain functions without changing the characteristic of the input matching, and a low noise amplifier can be provided with excellent linearity.

FIG. 5*c* is a circuit diagram for showing a selective matching circuit 3500 in accordance with an embodiment of the present invention for the variable gain low noise amplifier shown in FIG. 3 or FIG. 4.

As shown in FIG. 5*c*, the selective matching circuit 3500 in accordance with an embodiment of the present invention comprises the first and the second inductors L51, L52 and capacitor C51 and the second short circuit-means or switch SW2.

One of the terminals of the first inductor L51 is connected to the second inductor L52 and capacitor C51, the other terminal is connected to one of the terminals of the second short circuit-means SW2. The other terminal of the second inductor L52 is formed to connect to the first terminal 309 of the selective matching circuit 3500, the other terminal of the capacitor C51 is formed to connect to the second terminal 311 of the selective matching circuit 3500, the other terminal of the second short circuit-means SW2 is grounded.

In the selective matching circuit 3500 in accordance with an embodiment of the present invention, the second short circuit-means SW2 can display the capability of the best suited circuit in a state in which the first amplifying cell 3300 is activated by high gain mode driven HG-biasing; in case of low gain mode, i.e., HG-biasing is not driven, the selective matching circuit 3500 is selected to have an input impedance of the high gain mode circuit block which is made by selective matching circuit 3500 and the first amplifying cell 3100, in case the first amplifying cell 3100 is not activated.

FIG. 6*a* shows a circuit diagram of the variable gain low noise amplifier shown in FIG. 3 using circuits shown in FIGS. 5*a*, 5*b*, and 5*c*.

As shown in FIG. 6*a*, a variable gain low noise amplifier in accordance with an embodiment of the present invention comprises the first and second amplifying cells 3100, 3300, the selective matching circuit 3500, and the first short circuit-means or switch SW1.

The first amplifying cell 3100 is embodied in the form of a common-source and is operated in the high gain mode, and the second amplifying cell 3300 is embodied in the form of a common-gate and is operated in the low gain mode. Moreover, the selective matching circuit 3500 comprises the second short circuit-means, and in high gain mode, the input of the first amplifying cell 3100 is matched by the selective matching circuit 3500 in order that the first amplifying cell 3100 can display the capability of the best suited circuit; and in the low gain mode, the input impedance of the first amplifying cell 3100 is changed to a high data mode by the selective matching circuit 3500, and the first amplifying cell 3100 is not operated using the load of the second amplifying cell 3300. Therefore, the variable gain low noise amplifier in accordance with an embodiment of the present invention can display the capability of the best suited circuit in each gain mode.

Also, a variable gain low noise amplifier in accordance with an embodiment of the present invention uses with a common-source the first amplifying cell 3100 in the high gain mode that demands high noise and gain characteristics, and uses a common-gate with the second amplifying cell 3100 in the low gain mode that demands high linearity and successive variable gain, as a consequence of that, linearity is good, input matching is easy, and the amplifier can have a variable gain low noise amplifier with possible successive variable gain functions.

Furthermore, in case the power level of the receiving signal is enough large and amplifying is not needed because the receiving signal is directly passed to the output terminal by the fourth short circuit-means or switch SW4 shown in FIG. 4, power consumption that is demanded for the amplifying operation is not needed.

FIG. 6*b* and FIG. 6*c* are circuit diagrams shown in equivalent input parts of the first amplifying cell 3100 in order to describe more specifically the operation of the selective matching circuit 3500 in accordance with an embodiment of the present invention in the case a variable gain low noise amplifier is operated in the high gain mode or the low gain mode.

In the high gain mode, the second short circuit-means is open, and the input activating the first amplifying cell 3100 can be shown in a equivalent ZHG, on. At this time, the variable gain low noise amplifier can be gotten the capability of the best suited circuit by matching the input impedance of the first amplifying cell 3100 by using the second inductor L52 and capacitor C51. That is, because the electric powers of the variable gain low noise amplifier and the first amplifying cell 3100, the high gain mode characteristic of the best suited circuit can be realized.

In the low gain mode, the second short circuit-means is short and inactivating the input of the first amplifying cell 3100 can be shown in a equivalent ZLG, off. Here, ZLG, off as shown in the views is very different from the ZHG, on data, in this case, the matching circuit 3500 comprises the first and the second inductor L51, L52 and capacitor C51. The first inductor L51 handles inductance data that are sent to the input part of the first amplifying cell 3100 providing substantial infinite input impedance from the node 309. As it does in the low gain mode, the input part of the first amplifying cell 3100 is not affected by in the second amplifying cell 3300. Therefore, the input of the variable gain low noise amplifier is matched to the most suitable of input of the second amplifying cell 3300, because the maximum power Pin is transferred, and at the same time, the power of the first amplifying cell 3100 is substantially zero, thus, variable gain low noise amplifier realizes the low gain mode characteristics of the best suited circuit.

INDUSTRIAL APPLICABILITY

In a low noise amplifier in accordance with the present invention, because the operating circuits in each gain mode is not affected by the performance of the operating circuit of the best suited circuit of the other gain mode, the each circuit can display the capability best suited to each mode.

Also, input matching, gain, noise characteristic and linearity etc, can display the capability best suited to each other in different gain modes.

Further, each circuit operates in a gain mode with at least two according to the size of the receiving signals, and can vary gain in the low gain mode.

Furthermore, because the output of each circuit can equal the receiving signals by the short circuit-means, amplifying operation is not needed, and the power consumption is reduced.

What is claimed is:

1. A variable gain low noise amplifier comprising:
    a first amplifying cell including a first terminal and second terminal being connected to an output terminal, said first amplifying cell being configured to amplify a signal from an input terminal being input to said first terminal and output to said second terminal in a high gain mode;
    a second amplifying cell including a first terminal and second terminal being connected to said output terminal, said second amplifying cell being configured to amplify said signal being input to said first terminal of said second amplifying cell and output to said second terminal of said second amplifying cell in a low gain mode;
    a selectively matching circuit including a first terminal being connected to said input terminal and a second terminal being connected to said first terminal of said first amplifying cell, said selectively matching circuit being configured to change selectively an input impedance of said first amplifying cell, said selectively matching circuit being configured to change said input impedance to maximize a power of said signal in said high gain mode, and to minimize said power of said signal in said low gain mode;
    a first switch being connected to said input terminal and said first terminal of said second amplifying cell, said first switch being configured to transmit said signal applied to said input terminal to said first terminal of said second amplifying cell in said low gain mode; and
    a second switch connecting said input terminal and said output terminal.

2. A variable gain low noise amplifier according to claim 1, further comprising a third switch connected between said second terminal of said second amplifying cell and said output terminal.

3. A variable gain low noise comprising:
- a first amplifying cell including a first terminal and second terminal being connected to an output terminal, said first amplifying cell being configured to amplify a signal from an input terminal being input to said first terminal and output to said second terminal in a high gain mode, said first amplifying cell comprises including first, second, and third terminals, an amplifying element, a resistor, and a degeneration impedance;
- a second amplifying cell including a first terminal and second terminal being connected to said output terminal, said second amplifying cell being configured to amplify said signal being, input to said first terminal of said second amplifying cell and output to said second terminal of said second amplifying cell in a low gain mode;
- a selectively matching circuit including a first terminal being connected to said input terminal and a second terminal being connected to said first terminal of said first amplifying cell, said selectively matching circuit being configured to change selectively an input impedance of said first amplifying cell, said selectively matching circuit being configured to change said input impedance to maximize a power of said signal in said high gain mode, and to minimize said power of said signal in said low rain mode;
- a first switch being connected to said input terminal and said first terminal of said second amplifying cell, said first switch being configured to transmit said signal applied to said input terminal to said first terminal of said second amplifying cell in said low gain mode; and
- a second switch being connected between said input terminal and said output terminal.

4. A variable gain low noise amplifier comprising:
- a first amplifying cell including a first terminal and second terminal being connected to an output terminal, said first amplifying cell being configured to amplify a signal from an input terminal being input to said first terminal and output to said second terminal in a high gain mode;
- a second amplifying cell including a first terminal and second terminal being connected to said output terminal, said second amplifying cell being configured to amplify said signal being input to said first terminal of said second amplifying cell and output to said second terminal of said second amplifying cell in a low gain mode, said second amplifying cell including first, second, and third terminals, and
  - a first amplifying element being configured to control an amount of current flowing from said first terminal of said second amplifying cell to said second terminal of said second amplifying cell in proportion to voltage applied to said third terminal of said second amplifying cell,
- second and third amplifying elements, a voltage source, and a variable voltage source being configured to control an amount of current flowing from said first terminal to said second terminal in proportion to the voltage applied to said third terminal;
- a selectively matching circuit including a first terminal being connected to said input terminal and a second terminal being connected to said first terminal of said first amplifying cell, said selectively matching circuit being configured to change selectively an input impedance of said first amplifying cell, said selectively matching circuit being configured to change said input impedance to maximize a power of said signal in said high gain mode, and to minimize said power of said signal in said low gain mode;
- a first switch being connected to said input terminal and said first terminal of said second amplifying cell, said first switch being configured to transmit said signal applied to said input terminal to said first terminal of said second amplifying cell in said low gain mode; and
- a second switch being connected between said input terminal and said output terminal.

5. A variable gain low noise amplifier comprising:
- a first amplifying cell including a first terminal and second terminal being connected to an output terminal, said first amplifying cell being configured to amplify a signal from an input terminal being input to said first terminal and output to said second terminal in a high gain mode;
- a second amplifying cell including a first terminal and second terminal being connected to said output terminal, said second amplifying cell being configured to amplify said signal being input to said first terminal of said second amplifying cell and output to said second terminal of said second amplifying cell in a low gain mode;
- a selectively matching circuit including a first terminal being connected to said input terminal and a second terminal being connected to said first terminal of said first amplifying cell, said selectively matching circuit being configured to change selectively an input impedance of said first amplifying cell, said selectively matching circuit being configured to change said input impedance to maximize a power of said signal in said high gain mode, and to minimize said power of said signal in said low gain mode, said selectively matching circuit includes first and second inductors, a capacitor, and a switch, and one terminal of said first inductor being connected to said second inductor and said capacitor, another terminal being connected to said switch of said selectively matching circuit, another terminal of said second inductor being formed to be a first terminal of said matching circuit, another terminal of said capacitor being formed to be a second terminal of said matching circuit, and another terminal of said short-circuit means being grounded;
- a first switch being connected to said input terminal and said first terminal of said second amplifying cell, said first switch being configured to transmit said signal applied to said input terminal to said first terminal of said second amplifying cell in said low gain mode; and
- a second switch being connected between said input terminal and said output terminal.

6. The variable gain low noise amplifier according to claim 3, wherein
- said amplifying element, resistor, and degeneration impedance control an amount of current flowing from said first terminal to said second terminal in proportion to a voltage applied to said third terminal, and
- a first terminal of said amplifying element is formed to connect to said second terminal of said first amplifying cell, said second terminal is connected to one terminal of said degeneration impedance, said third terminal is connected to one terminal of said resistor and to said first terminal of said first amplifying cell, another terminal of said resistor is applied to HG-bias voltage to activate said first amplifying cell in said high gain mode, another terminal of said degeneration impedance is grounded, and said amplifying element is connected to a common node of said second terminal.

7. The variable gain low noise amplifier according to claim 4, wherein said second terminal of said first amplifying element is formed to connect to said first terminal of said second amplifying cell, and said third terminal of said first amplifying element is applied to the LG-bias voltage to activate said second amplifying cell in said low gain mode, and said first amplifying element includes an amplifying unit connected to common node of said third terminal of said first amplifying element.

8. The variable gain low noise amplifier according to claim 7, wherein said first terminal of said second amplifying element is formed to connect to said second terminal of said second amplifying cell, said second terminal of said second amplifying element is connected to said first terminal of said first amplifying element by connecting to said second terminal of said third amplifying element, said third terminal of said second amplifying element is connected with one terminal of said voltage source, said first terminal of said third amplifying element is connected to a power source, said third terminal of said third amplifying element is connected to said variable voltage source, and the other terminals of said voltage source and variable voltage source are grounded.

* * * * *